(12) United States Patent
Park et al.

(10) Patent No.: US 6,579,767 B2
(45) Date of Patent: Jun. 17, 2003

(54) METHOD FOR FORMING ALUMINUM OXIDE AS A GATE DIELECTRIC

(75) Inventors: Dae-Gyu Park, Ichon-shi (KR); Se-Aug Jang, Ichon-shi (KR); Jeong-Youb Lee, Ichon-shi (KR); Hung-Jae Cho, Ichon-shi (KR); Jung-Ho Kim, Ichon-shi (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/727,583

(22) Filed: Dec. 4, 2000

(65) Prior Publication Data

US 2001/0029092 A1 Oct. 11, 2001

(30) Foreign Application Priority Data

Dec. 27, 1999 (KR) .......................................... 99-62964

(51) Int. Cl.$^7$ ............................................. H01L 29/227
(52) U.S. Cl. ..................... 438/287; 438/296; 438/297; 438/591; 438/783
(58) Field of Search ................................. 438/287, 296, 438/297, 591, 778, 783, 925, FOR 193, FOR 227, FOR 229, FOR 396

(56) References Cited

U.S. PATENT DOCUMENTS

| 3,642,545 | A | * | 2/1972 | Pammer et al. |
| 3,766,637 | A | * | 10/1973 | Norris et al. |
| 3,775,262 | A | * | 11/1973 | Heyerdahl |
| 4,460,413 | A | * | 7/1984 | Hirata et al. |
| 4,566,173 | A | * | 1/1986 | Gössler et al. |
| 5,079,184 | A | * | 1/1992 | Hatano et al. |
| 5,923,056 | A | * | 7/1999 | Lee et al. |

\* cited by examiner

*Primary Examiner*—Olik Chaudhuri
*Assistant Examiner*—Joannie Garcia
(74) *Attorney, Agent, or Firm*—Finnegan, Henderson, Farabow, Garrett & Dunner, L.L.P.

(57) ABSTRACT

A method for forming a gate structure begins by preparing a semiconductor substrate provided with an isolation region formed therein. A thin SiO$_2$ layer is thermally grown on top of the semiconductor device by using a wet H$_2$/O$_2$ or a dry O$_2$. And then, an aluminum oxide layer is formed on top of the semiconductor substrate with doping a dopant in situ. A conductive layer is formed on top of the Al$_2$O$_3$ layer. Finally, the conductive layer and the Al$_2$O$_3$ layer are patterned into the gate structure. The dopant is a material selected from a group consisting of Si, Zr, Hf, Nb or the like.

18 Claims, 6 Drawing Sheets

METHOD FOR FORMING ALUMINUM OXIDE AS A GATE DIELECTRIC

FIELD OF THE INVENTION

The present invention relates to a semiconductor device; and, more particularly, to a method for manufacturing a gate structure incorporated therein aluminum oxide as a gate dielectric.

DESCRIPTION OF THE PRIOR ART

As is well known, a semiconductor device has been down-sized by a scale down of a design rule. Therefore, a gate oxide tends to rapidly approach 30 Å in thickness and below to increase the capacitance between a gate electrode and a channel region. However, the use of silicon dioxide as a gate dielectric is limited at this thickness and below. Once silicon dioxide $SiO_2$ is formed to a thickness of less than 30 Å, direct tunneling may occur through the gate dielectric to the channel region, thereby increasing a leakage current associated with the gate electrode and the channel region, causing an increase in power consumption.

Since reducing the thickness of the gate dielectric inherently increases the gate-to-channel leakage current, alternative methods have been developed to reduce this leakage current while maintaining thin $SiO_2$ equivalent thickness. One of these methods is to use a high K dielectric material such as $Ta_2O_5$ as the gate dielectric material to increase the capacitance between the gate and the channel.

However, if a poly-silicon is utilized as a gate electrode, the use of $Ta_2O_5$ for gate dielectric materials has a disadvantage in integrating the semiconductor device. That is, an undesired $SiO_2$ and $TaSi_2$ are formed at an interface between $Ta_2O_5$ and the poly-silicon, which, in turn, increases an equivalent oxide thickness. In order to overcome this problem, a barrier metal such as TiN is employed. However, the TiN makes a threshold voltage shift changed.

In addition, the use of high K dielectrics for gate dielectric materials is disadvantageous in integrated circuits because high dielectric materials contain great number of bulk traps and interface traps than gate dielectrics made from thermally grown $SiO_2$. These traps adversely effect sub-threshold slope and threshold voltage operation of electric devices.

If the above-described problems are overcome, a high K dielectric is utilized as a gate oxide with excellent leakage current as well as a low interface state with both a gate electrode and a silicon substrate.

SUMMARY OF THE INVENTION

It is, therefore, an object of the present invention to provide a method for manufacturing a gate structure incorporated therein aluminum oxide as a gate oxide for use in a semiconductor device.

In accordance with one aspect of the present invention, there is provided a method for manufacturing a gate structure for use in a semiconductor device, the method comprising the steps of: a) preparing a semiconductor substrate provided with an isolation region formed therein; b) forming an aluminum oxide ($Al_2O_3$) layer on top of the semiconductor substrate with doping a dopant in situ; c) forming a conductive layer on top of the $Al_2O_3$ layer; and d) patterning the conductive layer, thereby obtaining the gate structure.

In accordance with another aspect of the present invention, there is provided a method for method for manufacturing a gate structure for use in a semiconductor device, the method comprising the steps of: a) preparing a semiconductor substrate provided with an isolation region formed therein; b) forming an $Al_2O_3$ layer on top of the semiconductor substrate; c) forming a conductive layer on top of the $Al_2O_3$ layer; d) implanting dopants into the $Al_2O_3$ layer; e) patterning the conductive layer and the $Al_2O_3$ layer into the gate structure; and f) selectively reoxidizing the dopants.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1E and FIGS. 2A to 2E cross sectional views setting forth methods for manufacturing gate structures 100, 200 for use in a semiconductor device in accordance with preferred embodiments of the present invention.

Figure 1A:
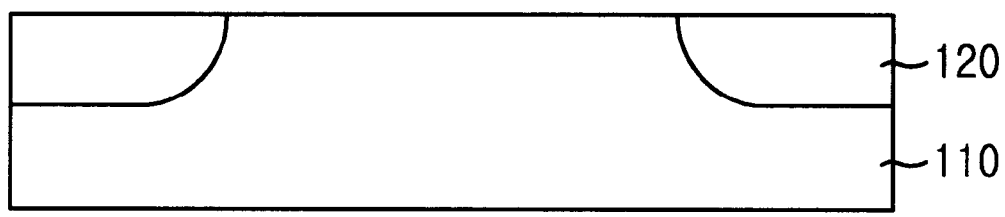
FIGS. 1A to 1E are schematic cross sectional views setting forth a method for the manufacture of a gate structure incorporated therein aluminum oxide as a gate oxide in accordance with a first preferred embodiment of the present invention.

Referring to FIG. 1A, the process for manufacturing the gate structure 100 begins with the preparation of a semiconductor substrate 110 including an isolation region 120 for defining an active region. The isolation region 120 may be formed in a structure of local oxidation of silicon (LOCOS) or in a structure of shallow trench isolation (STI).

Optionally, an ultra thin silicon dioxide ($SiO_2$) layer (not shown) may be thermally grown on the semiconductor substrate 110 by using a wet $H_2/O_2$ or a dry $O_2$ at a temperature ranging from approximately 650° C. to approximately 950° C. It is preferable that the ultra thin silicon $SiO_2$ layer has a thickness ranging from approximately 3 Å to approximately 20 Å. Alternatively, it is possible that the ultra thin silicon $SiO_2$ layer can be formed by using a rapid thermal process (RTP) at a temperature ranging from approximately 700° C. to approximately 900° C. in the presence of oxygen gas or $N_2O$ gas. It is preferable that the RTP is carried out in a pressure ranging from approximately 0.1 torr to approximately 1.0 torr.

Figure 1B:
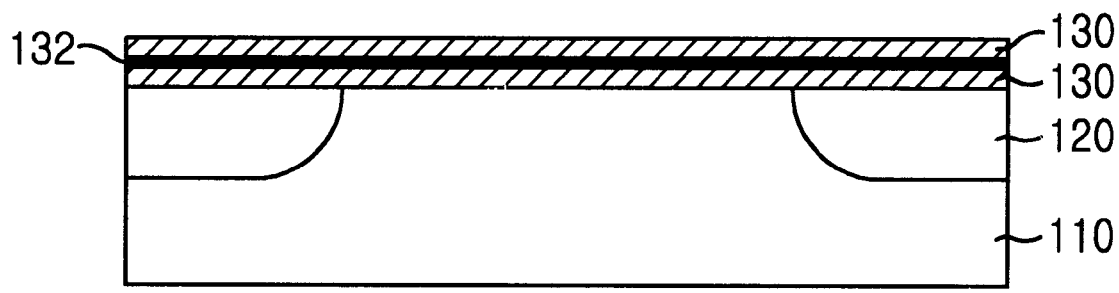

Referring to FIG. 1B, an aluminum oxide ($Al_2O_3$) layer 130 is formed on top of the semiconductor substrate 110 by using a low pressure chemical vapor deposition (LPCVD) at a temperature ranging from approximately 150° C. to approximately 700° C. In this case, Al source gas can be selected from a group consisting of tri methyl aluminum (TMA), $Al(CH_3)_2Cl$, $AlCl_3$ or the like. It is possible that the $Al_2O_3$ layer 130 is formed by using a plasma enhanced chemical vapor deposition process (PECVD) at a temperature ranging from approximately 150° to approximately 700° C. Dopants 132 are doped into the ($Al_2O_3$) layer 130 in situ by using an atomic layer deposition (ALD) at one to two monolayer thickness of dopant. The dopants 132 can be selected from the group consisting of silicon (Si), zirconium (Zr), hafnium (Hf), niobium (Nb) or the like. If the dopants 132 are Si, a source gas can be selected from a group consisting of $SiH_4$, $SiCl_4$, $Si_2H_4$ or the like. In this case, the concentration of Si is controlled within a range from approximately 0.1 to approximately 5% on the basis of weight by diluting the source gas with Ar gas. Alternatively, if dopants are Zr, a source gas can be selected from a group consisting of $ZrCl_4$, $HfCl_4$, tetrakis (tetramethylamido) zirconium $[(C_{10}H_{19}O_2)_4Zr]$ or the like. In this case, it is preferable that a concentration of Zr is controlled within a range from approximately 0.1% to approximately 5% on the basis of weight by diluting the source gas with Ar gas.

Figure 1C:
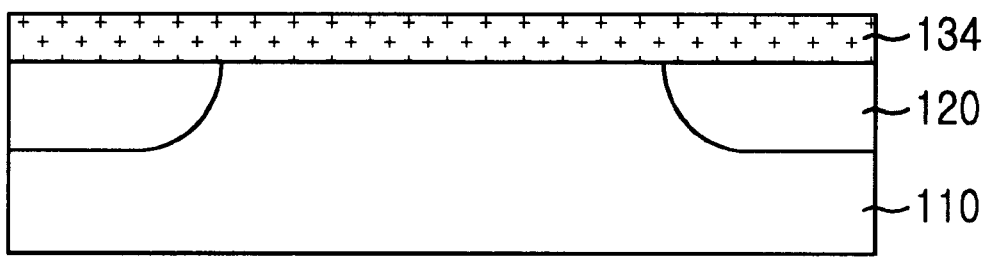
Figure 1D:
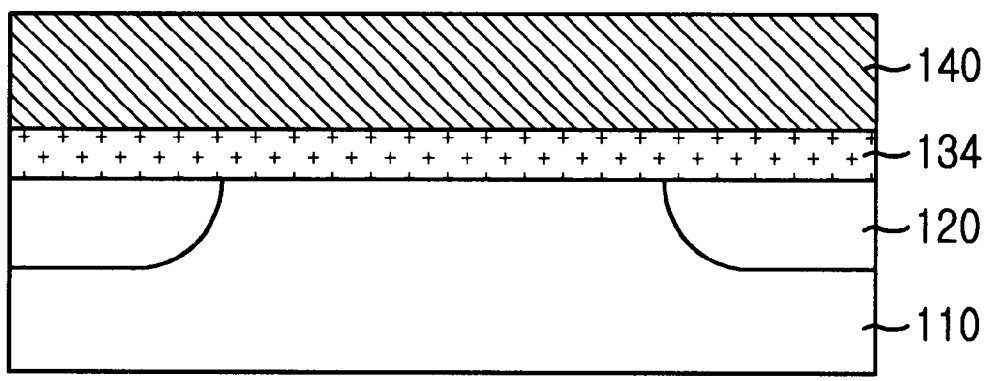

Referring to FIG. 1C, the dopants 132 are diffused into the $Al_2O_3$ layer 130 by heat-treating the $Al_2O_3$ layer 130, thereby obtaining a doped $Al_2O_3$ layer 134. Optionally, the doped $Al_2O_3$ layer 134 is annealed by using a UV ozone ($O_3$) at a temperature ranging from approximately 300° C. to approximately 550° C. for 3–30 minutes to remove an unwanted organic materials in the $Al_2O_3$ layer 130.

Referring to 1D, a conductive layer 140 is formed on top of the $Al_2O_3$ layer 130. The conductive layer 140 can be made of a material selected from a group consisting of, a poly-Si, a doped poly-Si, amorphous-Si, W-polycide, Ti-polycide, Co-polycide, Mo-polycide, W, Ta, WN, TiN or the like.

Figure 1E:
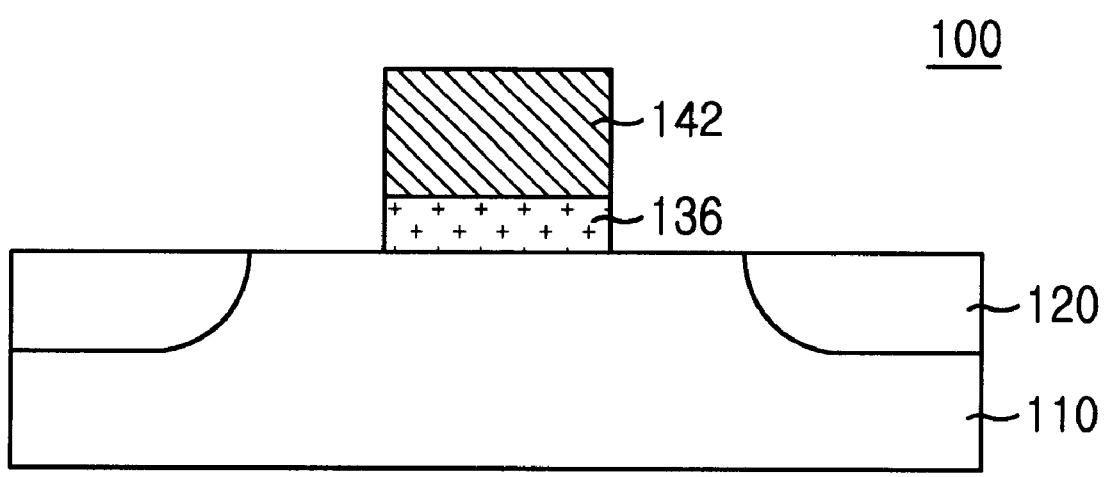

Referring to FIG. 1E, the conductive layer 140 and the doped $Al_2O_3$ layer 134 are patterned into a predetermined configuration, thereby obtaining a gate electrode 142 and a gate dielectric 136.

Referring to FIGS. 2A to 2E, there are schematic cross sectional views setting forth a method for the manufacture of a gate structure incorporated therein aluminum oxide as a gate oxide in accordance with a second preferred embodiment of the present invention.

Figure 2A:
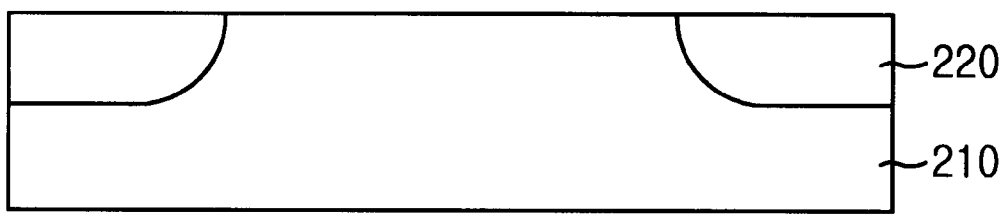
FIGS. 2A to 2E are schematic cross sectional views setting forth a method for the manufacture of a gate structure incorporated therein aluminum oxide as a gate oxide in accordance with a second preferred embodiment of the present invention.

Referring to FIG. 2A, the process for manufacturing the gate structure 200 begins with the preparation of a semiconductor substrate 210 including an isolation region 220 for defining an active region. The isolation region 220 may be formed in a structure of LOCOS or in a structure of STI.

Optionally, a thin $SiO_2$ layer (not shown) may be thermally grown on the semiconductor substrate 210 by using a wet $H_2/O_2$ or a dry $O_2$ at a temperature ranging from approximately 650° C. to approximately 950° C. It is preferable that the ultra thin silicon $SiO_2$ layer has a thickness ranging from approximately 3 Å to approximately 20 Å. Alternatively, it is possible that the ultra thin silicon $SiO_2$ layer can be formed by using RTP at a temperature ranging from approximately 700° C. to approximately 900° C. in the presence of an oxygen gas or a $N_2O$ gas. It is preferable that the RTP is carried out in a pressure ranging from approximately 0.1 torr to approximately 1.0 torr.

Figure 2B:
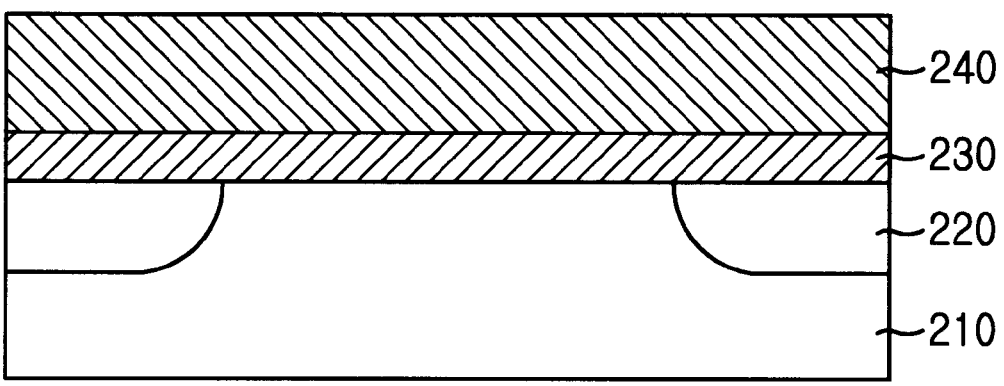

Referring to FIG. 2B, an $Al_2O_3$ layer 230 is formed on top of the semiconductor substrate 210 by using CVD at a temperature ranging from approximately 150° C. to approximately 700° C. In this case, Al source gas can be selected from a group consisting of TMA, $Al(CH_3)_2Cl$, $AlCl_3$ or the like. It is possible that the $Al_2O_3$ layer 230 is formed by using an ALD in the presence of oxygen.

Thereafter, a conductive layer 240 is formed on top of the $Al_2O_3$ layer 230. The conductive layer 240 can be made of a material selcted from a group consisting of, a poly-Si, a doped poly-Si, amorphous-Si, W-polycide, Ti-polycide, Co-polycide, Mo-polycide, W, Ta, WN, TaN, TiN or the like. It is preferable that the conductive layer 240 has a thickness ranging from approximately 500 Å to approximately 2,000 Å.

Figure 2C:
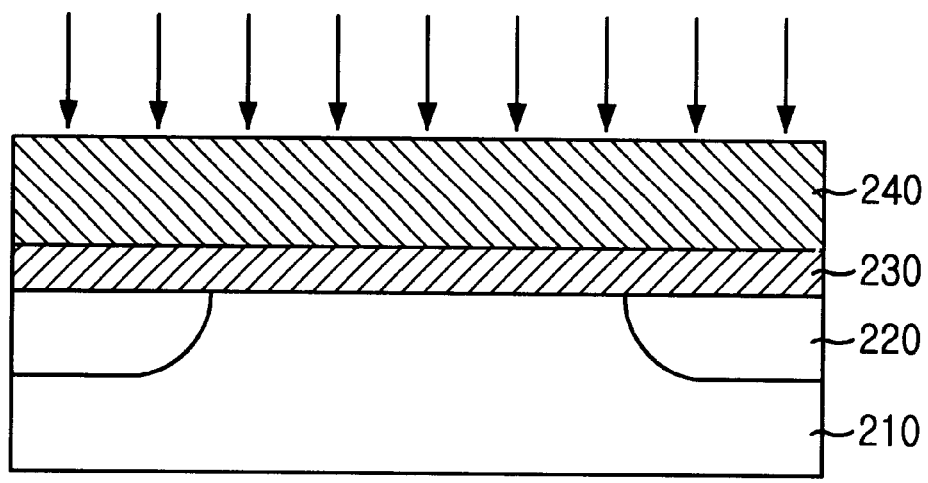

Referring to FIG. 2C, dopants are doped into the $Al_2O_3$ layer 230 by using an ion implantation method. The dopants can be selected from a group consisting of Si, Zr, Hf, Nb or the like. The ion implantation is carried out at a low energy with high dosage. It is preferable that a dosage of dopants is ranged from approximately $5*10^{14}$ to approximately $1*10^{16}$ ions/$cm^2$.

Figure 2D:
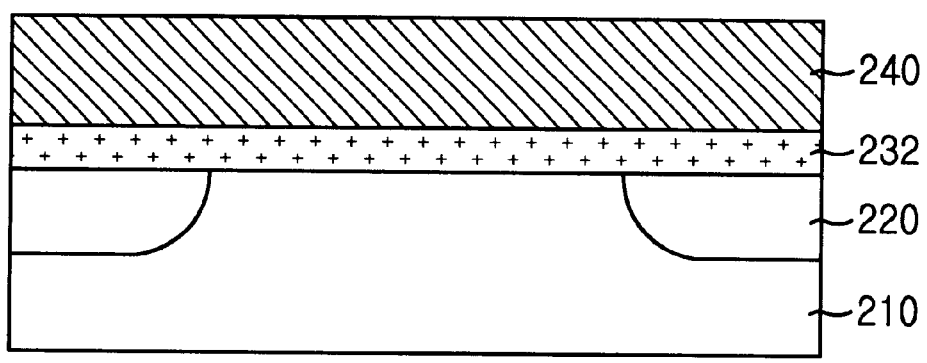

Referring to FIG. 2D, the dopants are diffused into the $Al_2O_3$ layer 230 by using an annealing method, thereby obtaining a doped $Al_2O_3$ layer 232. The annealing process can be carried out by using UV ozone at a temperature ranging from approximately 300° C. to approximately 500° C. Alternatively, the annealing process can be carried out by using a furnace at a temperature ranging from approximately 300° C. to approximately 500° C. in the presence of $N_2O$. It should be noted that implementing the ion implantation and the annealing processes reduces metal vacancy of the $Al_2O_3$ layer 230. Further, since the ion implantation process is carried out after the formation of the conductive layer 240, the semiconductor substrate 210 is protected from the ion implantation process.

Figure 2E:
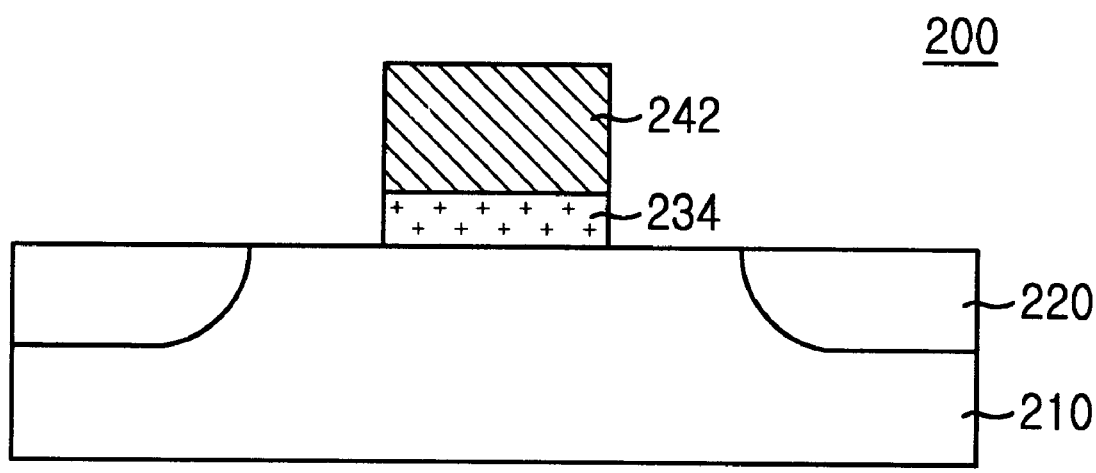

Referring to FIG. 2E, the conductive layer 240 and the doped $Al_2O_3$ layer 232 are patterned into a predetermined configuration, thereby obtaining a gate electrode 242 and a gate dielectric 234. A material such as $SiO_2$, SiON, $Al_2O_3$, or $Si_3N_4$ can be used as a hard mask during the patterning process. Finally, a lightly doped drain (LDD) selective oxidation process is carried out on the gate dielectric 234 and the gate electrode 242 at a temperature ranging from approximately 700° C. to approximately 850° C. in the presence of oxygen or nitrous oxide, which selectively reoxidizes the dopants.

The present invention thus provides gate dielectrics having a higher dielectric constant than $SiO_2$, excellent leakage current, low interface state density, and good thermal stability with Si by utilizing $Al_2O_3$ as a gate dielectric. This is achieved by doping a dopant such as Si, Zr, Hf, Nb or the like into the $Al_2O_3$ gate dielectric.

While the present invention has been described with respect to the particular embodiments, it will be apparent to those skilled in the art that various changes and modifications may be made without departing from the scope of the invention as defined in the following claims.

What is claimed is:

1. A method for manufacturing a gate structure for use in a semiconductor device, the method comprising:
    a) preparing a semiconductor substrate provided with an isolation region formed therein;
    b) forming in situ an aluminum oxide ($Al_2O_3$) layer on top of the semiconductor substrate using a niobium (Nb) dopant in situ;
    c) forming a conductive layer on top of the $Al_2O_3$ layer; and
    d) patterning the conductive layer, thereby obtaining the gate structure.

2. The method of claim 1, between a) and b), further comprising thermally growing a thin silicon dioxide ($SiO_2$) layer at a temperature ranging from approximately 650° C. to approximately 950° C.

3. The method of claim 2, wherein said thermal growing of a silicon dioxide layer is carried out by using rapid thermal process (RTP) in the presence of oxygen gas.

4. The method of claim 1, wherein b) is carried out by using low pressure chemical vapor deposition (LPCVD) at a temperature ranging from approximately 150° C. to approximately 700° C. in the presence of oxygen.

5. The method of claim 1, wherein b) is carried out by using plasma enhanced chemical vapor deposition (PECVD) at a temperature ranging from approximately 150° C. to approximately 700° C. in the presence of oxygen.

6. The method of claim 1, wherein b) is carried out by using delta doping, thereby forming a one to two monolayer thickness of dopant into the $Al_2O_3$ layer.

7. The method of claim 6, wherein the delta doping is carried out by using an atomic layer deposition (ALD) method.

8. The method of claim 6, after b), further comprising heat-treating the $Al_2O_3$ layer to diffuse the dopant into the $Al_2O_3$ layer.

9. A method for manufacturing a gate structure for use in a semiconductor device, the method comprising:
   a) preparing a semiconductor substrate provided with an isolation region formed therein;
   b) forming an $Al_2O_3$ layer on top of the semiconductor substrate;
   c) forming a conductive layer on top of the $Al_2O_3$ layer;
   d) implanting at least one dopant into the $Al_2O_3$ layer;
   e) patterning the conductive layer and the $Al_2O_3$ layer into the gate structure; and
   f) reoxidizing the at least one dopant.

10. The method of claim 9, further comprising, between a) and b), forming a thin $SiO_2$ layer by rapid thermal process (RTP) annealing at a temperature ranging from approximately 700° C. to approximately 950° C. in an oxygen atmosphere.

11. The method of claim 9, after b), further comprising heat-treating the $Al_2O_3$ layer.

12. The method of claim 9, wherein b) is carried out by using a CVD method at a temperature ranging from 150° C. to approximately 700° C. in the presence of oxygen.

13. The method of claim 9, wherein b) is carried out by using an atomic layer deposition (ALD) method in the presence of oxygen.

14. The method of claim 9, after b), further comprising heat-treating the $Al_2O_3$ layer by using UV ozone ($O_3$) at a temperature ranging from approximately 300° C. to approximately 500° C.

15. The method of claim 9, after the step d), further comprising the step of annealing the $Al_2O_3$ layer by using a furnace at a temperature ranging from approximately 300° C. to approximately 500° C. in the presence of nitrous oxide ($N_2O$).

16. The method of claim 9, wherein the dopant is a material selected from the group consisting of Si, Zr, Hf, and Nb.

17. The method of claim 9, wherein said reoxidizing at least one dopant in (f) is carried out at a temperature ranging from approximately 700° C. to approximately 850° C.

18. The method of claim 17, wherein said reoxidizing at least one dopant in (f) is carried out in the presence of oxygen or nitrous oxide.

* * * * *